(12) United States Patent
Nagasaka et al.

(10) Patent No.: US 7,309,855 B2
(45) Date of Patent: Dec. 18, 2007

(54) REFLECTIVE ENCODER WITH LIGHT SHIELD AND ELECTRONIC DEVICE USING SUCH REFLECTIVE ENCODER

(75) Inventors: Kohji Nagasaka, Osaka (JP); Kohichi Shichi, Nara (JP); Masato Sasaki, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/181,832

(22) Filed: Jul. 15, 2005

(65) Prior Publication Data

US 2006/0016970 A1    Jan. 26, 2006

(30) Foreign Application Priority Data

Jul. 26, 2004  (JP) ............................. 2004-217495

(51) Int. Cl.
*G01D 5/34* (2006.01)
*H01L 27/14* (2006.01)

(52) U.S. Cl. ................. 250/231.14; 250/239; 356/616; 356/617

(58) Field of Classification Search ............................... 250/231.13–231.18, 237 G, 237 R, 239; 356/616–617; 33/1 PT, 1 N, 1 L; 341/11, 341/13

See application file for complete search history.

(56) References Cited

U.S. PATENT DOCUMENTS

| | | | |
|---|---|---|---|
| 4,952,799 A | 8/1990 | Loewen | |
| 5,291,038 A * | 3/1994 | Hanamoto et al. | 257/82 |
| 5,317,149 A | 5/1994 | Uebbing et al. | |
| 6,410,911 B1 * | 6/2002 | Omi | 250/231.13 |
| 6,507,048 B1 * | 1/2003 | Makiya | 257/81 |
| 6,740,862 B2 * | 5/2004 | Paritsky et al. | 250/221 |
| 6,768,101 B1 * | 7/2004 | Lee et al. | 250/231.13 |
| 6,803,560 B1 * | 10/2004 | Okumura et al. | 250/231.16 |
| 6,972,402 B2 * | 12/2005 | Ohmura et al. | 250/231.13 |
| 6,998,601 B2 * | 2/2006 | Chin et al. | 250/231.13 |
| 7,019,281 B2 * | 3/2006 | Igaki et al. | 250/231.13 |
| 7,026,654 B2 * | 4/2006 | Igaki et al. | 257/80 |
| 2003/0059178 A1 * | 3/2003 | Kobayashi et al. | 385/94 |
| 2004/0211890 A1 * | 10/2004 | Setbacken et al. | 250/231.13 |
| 2005/0087681 A1 * | 4/2005 | Chin et al. | 250/231.13 |

\* cited by examiner

*Primary Examiner*—Davienne Monbleau
(74) *Attorney, Agent, or Firm*—Birch, Stewart Kolasch & Birch, LLP

(57) ABSTRACT

A reflection encoder is disclosed having a light emitting element in a light receiving element that are separated by a light shielding body that prevents unwanted light from entering the light receiving element. In variations of the invention, the light shielding body may be integrally formed with a mold resin portion that holds the light emitting element and light receiving element, formed by a sheet or plate, or formed using an opaque liquid resin that is poured between transparent resin bodies that encapsulate the light emitter and receiver. In operation, light radiated from the light emitting element is reflected by a code wheel and then received by a light receiving element. Other variations include varying the height at which the light receiving and detecting elements are disposed relative to the code wheel and tilting these elements towards each other so as to increase light efficiency.

1 Claim, 11 Drawing Sheets

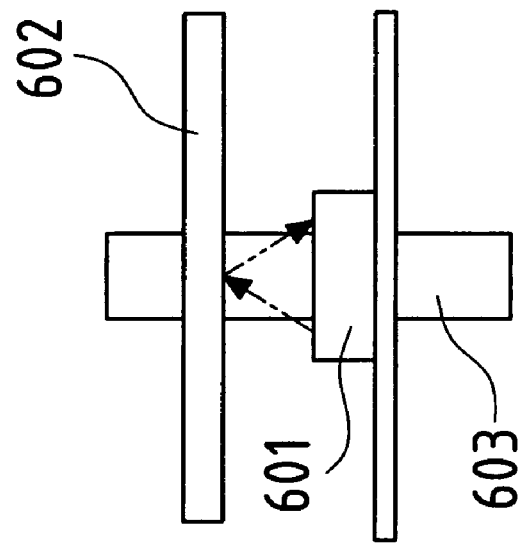
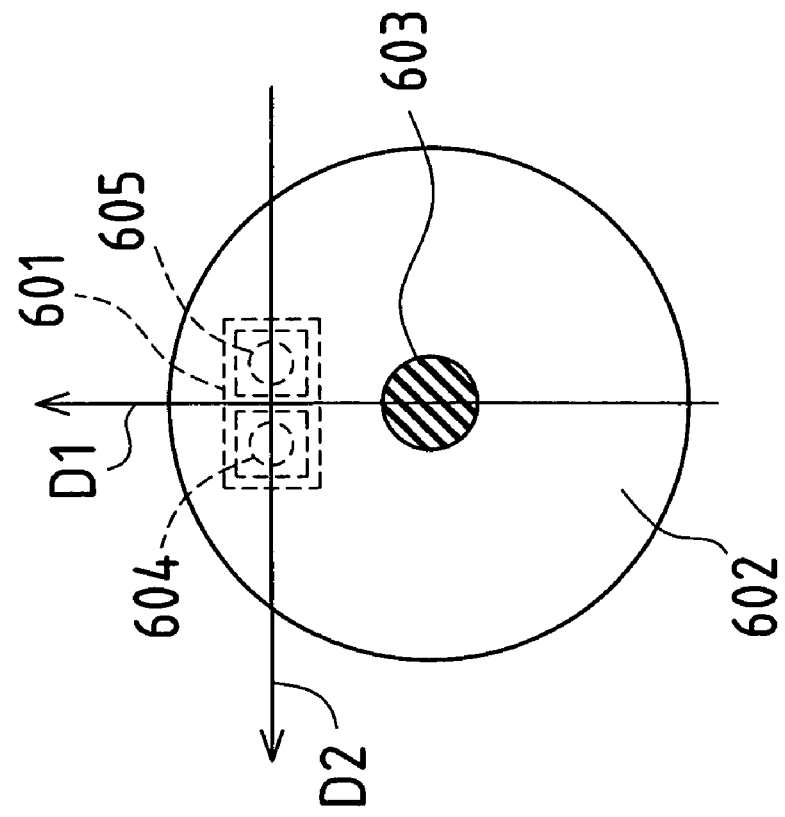

REFLECTIVE ENCODER WITH LIGHT SHIELD AND ELECTRONIC DEVICE USING SUCH REFLECTIVE ENCODER

CROSS REFERENCE TO RELATED APPLICATIONS

This application claims priority under 35 U.S.C. § 119(a) on Patent Application No. 2004-217495 filed in Japan on Jul. 26, 2004, the entire contents of which are hereby incorporated by reference.

BACKGROUND OF THE INVENTION

1. Field of the Invention

The present invention relates to a reflective encoder, which is an optical system of an optical sensor used as a part of an optical shaft angle encoder for generating an electric signal to indicate the angular position or angular change of a shaft.

2. Description of the Related Art

FIG. 11 shows a structural example of a conventional reflective encoder.

The reflective encoder is an optical encoder provided with a capsule-shaped reflective sensor 1100 that detects a modulated light beam Pa1102 that is reflected from reflective regions 1104a of a code wheel 1104. The reflective sensor 1100 includes a light emitting element 1101 that illuminates the reflective regions 1104a and non-reflective regions 1104b of the code wheel 1104; at least one light detecting element 1102 that is arranged on the same substrate as the light emitting element 1101, in order to detect the modulated light beam Pa1102 that is reflected from the code wheel 1104; a frame 1107 on which the light emitting element 1101 and the light detecting element 1102 are mounted; and an epoxy resin portion 1103 that covers the surface of both the light emitting element 1101 and the light detecting element 1102, and protects the light emitting element 1101 and the light detecting element 1102.

In order to prevent a light beam Pb1102, which is undesirably reflected at the phase boundary between the epoxy resin portion 1103 and air, from reaching directly onto the light detecting element 1102, the reflective sensor 1100 contains a lens appropriately arranged between the light emitting element 1101 and the code wheel 1104. The lens also enlarges the image towards the light detecting element 1102, and thus by using a lens it is possible to use a more compact, less expensive light detecting element 1102.

The capsule-shaped reflective sensor 1100 shown in FIG. 11 includes individual lenses, namely a light emitting lens 1105 that covers the light emitting element 1101, and a light detecting lens 1106 that covers the light detecting element 1102. The light emitting element 1101 and the light detecting element 1102 are arranged in appropriate positions such that the light beam Pa1101 from the light emitting element 1101 is enlarged by the light emitting lens 1105, and is focused and emitted in the direction of the code wheel 1104, and the modulated light beam Pa1102 reflected from the code wheel 1104 is then enlarged and focused in the direction of the light detecting element 1102. It should be noted that it is possible to use such a double lens structure, which is compact and inexpensive, provided that high accuracy is maintained.

However, as an example of such a reflective encoder, there is an optical encoder in which a light emitting device and a photodetector are enclosed within a single transparent medium (see for example, JP H6-221874A (1994)).

The reflective encoder shown in FIG. 11 provides a number of advantages over reflective encoders that have been used up to now, namely being relatively inexpensive, and relatively compact, however there are problems, such as are indicated below, because the light emitting element and the light detecting element are both provided within the same transparent medium.

That is to say, the light beam Pb1101 from the light emitting element 1101 is internally reflected by the epoxy resin portion 1103 that protects the light emitting element 1101, and is irradiated as the light beam Pb1102 onto the adjacent light detecting element 1102. Thus, an undesired signal is generated in the light detecting element 1102.

FIG. 12 is a graph showing an example of an output waveform when an undesired signal is generated in the light detecting element, and FIG. 13 is a graph showing an example of an output waveform when an undesired signal is not generated in the light detecting element. In FIG. 12 and FIG. 13, the vertical axis indicates voltage, and the horizontal axis indicates time.

As illustrated, the output signal waveform when an undesired signal is generated in the light detecting element is shifted upward by a noise component N, when compared to the output signal waveform when the undesired signal is not generated in the light detecting element.

In reflective encoders, the degree of accuracy of signal detecting has a great influence on the performance of the reflective encoder. Thus, precision loss due to internal reflection is a significant problem. Also, in order to overcome such internal reflection, it is necessary to use a relatively high current for emitting light, leading to an increase in power use. Furthermore, from the result of experiments, it has been found that the undesired signal that directly enters the light detecting element from the light emitting element induces a noise component shift in the output signal waveform that is about ⅙ the amplitude of the output signal waveform. Therefore it is necessary to remove the noise component.

As above, the problem of the effect due to internal reflection is greater with reflective encoders than with reflective photo interrupters. As shown in FIG. 13, in order to improve performance, it is important that there is substantially no noise component in the output signal waveform.

On the other hand, there is also the problem that if the distance between the lens of the light emitting element and the lens of the light detecting element is large, then the amount of light emitted by the light emitting element that reaches the light detecting element is reduced.

SUMMARY OF THE INVENTION

The present invention has been achieved with consideration of the above-described facts, and it is an object thereof to provide reflective encoders that are capable of improved optical properties through the elimination of undesired signals by a light shielding body, and to provide more compact, more accurate electronic devices through the incorporation of such reflective encoders.

A reflective encoder of the present invention is provided with a light emitting portion having a light emitting element capable of irradiating light and a light emitting side transparent resin body for covering and protecting the light emitting element, a light detecting portion having a light receiving element for detecting light that is irradiated from the light emitting element and that is reflected by a reflecting region of a code wheel, and a light receiving side transparent resin body for covering and protecting the light receiving element, and a light shielding body arranged between the light emitting side transparent resin body and the light receiving side transparent resin body for separating the light emitting portion and the light detecting portion. As a result, the light from the light emitting portion side is prevented from directly entering the light detecting portion side by the light shielding body, and thus undesired signals in the light receiving element can be eliminated.

The reflective encoder of the present invention may be further provided with a secondary mold resin portion for fixing the light emitting portion and the light detecting portion, so as to maintain a predetermined distance, wherein the light shielding body is molded in a single piece with the secondary mold resin portion. In the case of such a configuration, it is possible both to form the light shielding body without increasing manufacturing steps, and to accurately position the light emitting portion and the light detecting portion.

In the reflective encoder of the present invention, the light shielding body may be formed from a plate or sheet-shaped member. In the case of such a configuration, the lens of the light emitting portion and the lens of the light detecting portion may be formed in a closer arrangement, and thus it is possible ensure the light reflected by the code wheel is efficiently and accurately incident on the light detecting portion.

In the reflective encoder of the present invention, the light shielding body may be formed by injecting, and then curing a liquid opaque resin into the space between the light emitting side transparent resin body and the light receiving side transparent resin body. In the case of such a configuration, the lens of the light emitting portion and the lens of the light detecting portion may be formed in an even closer arrangement, and thus it is possible ensure the light reflected by the code wheel is more efficiently and accurately incident on the light detecting portion.

In the reflective encoder of the present invention, the height of a light emitting side frame of the light emitting portion on which the light emitting element is mounted, and the height of a light receiving side frame of the light detecting portion on which the light receiving element is mounted may be different. In the case of such a configuration, the arrangement of the light emitting element and the light receiving element may be adjusted to an optimal position or height, thus improving the optical properties of the reflective encoder.

In the reflective encoder of the present invention, it is possible that the code wheel has a circular shape, and the light emitting portion and the light detecting portion are arranged in a direction which is perpendicular with respect to the diametrical direction of the code wheel. In the case of such a configuration, even if the code wheel is small, it is possible to arrange the reflective encoder directly below the code wheel.

In the reflective encoder of the present invention, it is possible that the code wheel has a circular shape, and the light emitting portion and the light detecting portion are arranged along the diametrical direction of the code wheel. In the case of such a configuration, since the light that strikes the code wheel is distributed symmetrically to the left and right about the diametrical direction of the code wheel, the light that enters the light detecting portion is symmetrical to the left and right. Thus, the output waveform of the optical signal improves, and an accurate signal can be provided.

In the reflective encoder of the present invention, it is possible that the light receiving element has a light detecting region and a signal processing circuit, the light detecting region is arranged away from the center of the reflective encoder, and the signal processing circuit is arranged toward the center of the reflective encoder. In the case of such a configuration, it is possible to prevent the light detecting portion from becoming large due to the signal processing circuit.

In the reflective encoder of the present invention, it is possible that a light emitting side lens is formed on the top portion of the light emitting side transparent resin body, and a light receiving side lens is formed on the top portion of the light receiving side transparent resin body, and the light emitting portion and the light detecting portion are arranged such that the optical axis of at least one of the light emitting side lens and the light receiving side lens is tilted toward the top of the light shielding body. In the case of such a configuration, the light from the light emitting portion may be used effectively.

In the reflective encoder of the present invention, the light emitting element may be arranged on the optical axis of the light emitting side lens. In the case of such a configuration, light efficiently enters the light emitting side lens.

In the reflective encoder of the present invention, the light receiving element may be arranged on the optical axis of the light receiving side lens. In the case of such a configuration, the light that enters the light receiving side lens is efficiently focused onto the light receiving element.

An electronic device of the present invention is a device in which at least one reflective encoder such as has been described above is used. As a result, light can be efficiently and accurately detected, and the performance of the electronic device can be improved.

BRIEF DESCRIPTION OF DRAWINGS

FIG. 7(a) is an explanatory diagram showing a top view of a reflective encoder associated with Embodiment 5 of the present invention, and FIG. 7(b) is a diagram showing a side view thereof.

DESCRIPTION OF THE PREFERRED EMBODIMENTS

The embodiments of the present invention are described below with reference to the drawings.

Embodiment 1

Figure 1:
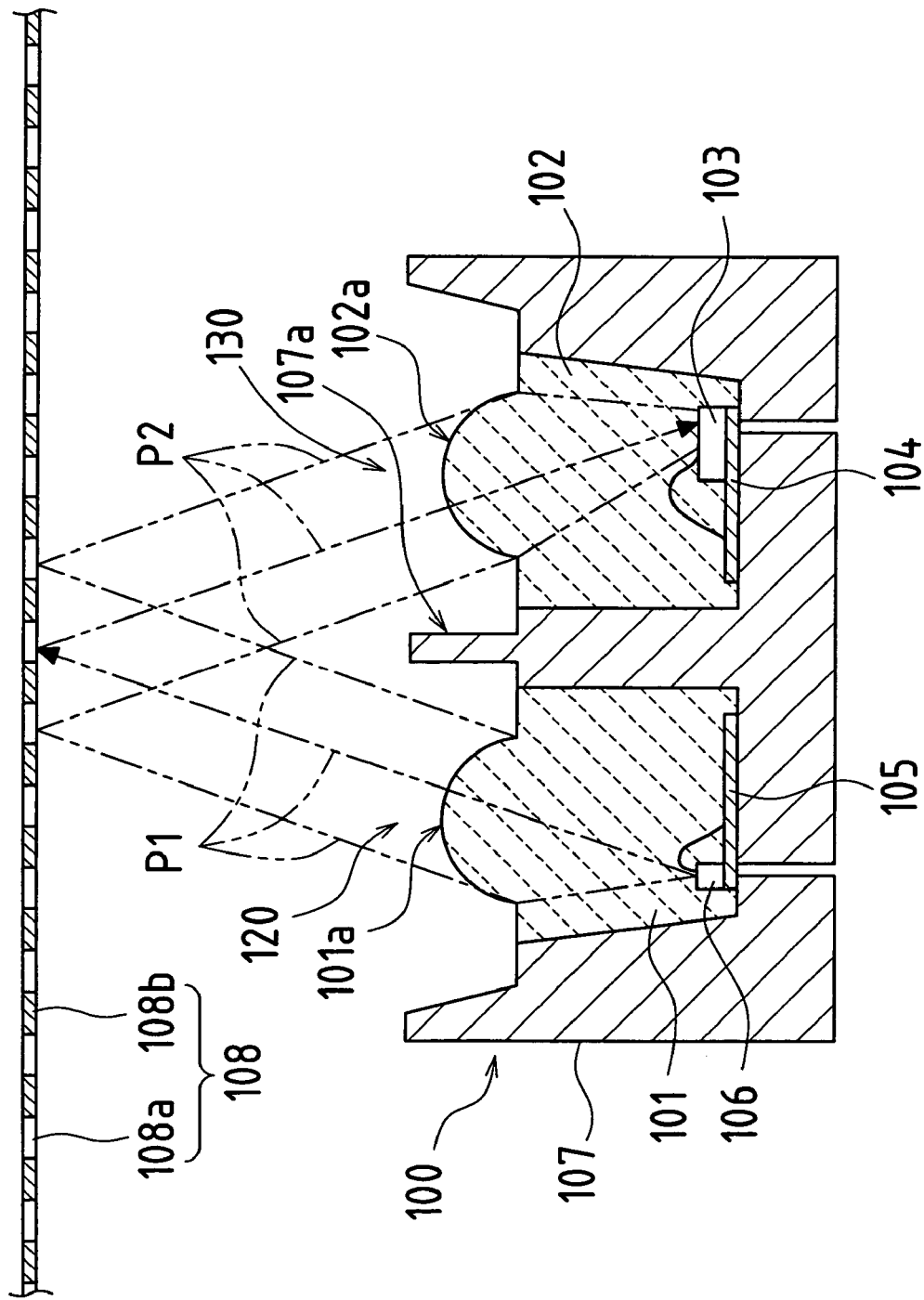
FIG. 1 is a cross-sectional view showing a reflective encoder associated with Embodiment 1 of the present invention.
Figure 2:
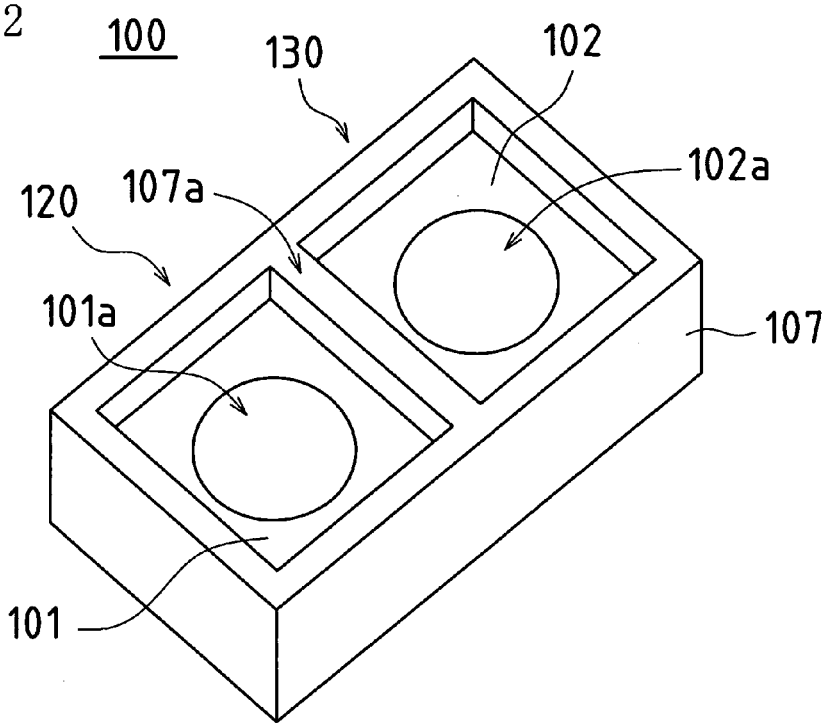
FIG. 2 is a perspective view showing the reflective encoder of FIG. 1.

FIG. 1 is a cross-sectional view showing a reflective encoder 100 associated with Embodiment 1 of the present invention, and FIG. 2 is a perspective view of the reflective encoder 100 of FIG. 1.

The reflective encoder 100 is provided with a light emitting portion 120, a light detecting portion 130, and a secondary mold resin portion 107 that fixes the light emitting portion 120 and the light detecting portion 130, for positioning the light emitting portion 120 and the light detecting portion 130.

The light emitting portion 120 has a light emitting side frame 105, a light emitting element 106 arranged on the light emitting side frame 105 and a light emitting side transparent resin body 101 that covers and protects the light emitting element 106. The upper portion of the light emitting side transparent resin body 101 is molded into a light emitting side lens 101a. The light detecting portion 130 has a light receiving side frame 104, a light receiving element 103 arranged on the light receiving side frame 104 and a light receiving side transparent resin body 102 that covers and protects the light receiving element 103. The upper portion of the light receiving side transparent resin body 102 is molded into a light receiving side lens 102a.

The secondary mold resin portion 107 is formed using an opaque resin. Those parts of the secondary mold resin portion 107 that are formed between the light emitting portion 120 and the light detecting portion 130 function as a light shielding body 107a Because the reflective encoder 100 has this configuration, a light beam P1 that is irradiated from the light emitting element 106 is focused by the light emitting side lens 101a, after which it is emitted toward a code wheel 108, wherein it strikes reflective portions 108a and non-reflective portions 108b on the code wheel 108. The light that hits the reflective portions 108a is reflected, and the light that hits the non-reflective portions 108b is not substantially reflected. As a result, when a reflected light beam P2 that is reflected from the code wheel 108 is focused by the light receiving side lens 102a and strikes the light receiving element 103, the intensity of the light varies. Thus, the rotational frequency and direction of the code wheel 108 can be determined by such light striking partitioned photodiodes (PD) that are formed on the light receiving element 103.

By using the reflective encoder 100 of the present Embodiment 1, and by the use of the light shielding body 107a it is possible to prevent light from the light emitting element 106 from directly entering the light receiving element 103 via the light emitting side transparent resin body 101 and the light receiving side transparent resin body 102.

It should be noted that the light shielding body 107a of the present Embodiment 1 is molded in a single piece with the secondary mold resin portion 107 at the same time when forming the secondary mold resin portion 107 using opaque resin. Furthermore, the secondary mold resin portion 107 also has the effect of accurately positioning the light emitting portion 120 and the light detecting portion 130.

Modified Example of Embodiment 1

An embodiment in which a light emitting element and a light receiving element are directly mounted on the same substrate is described next with reference to the drawings.

Figure 3:
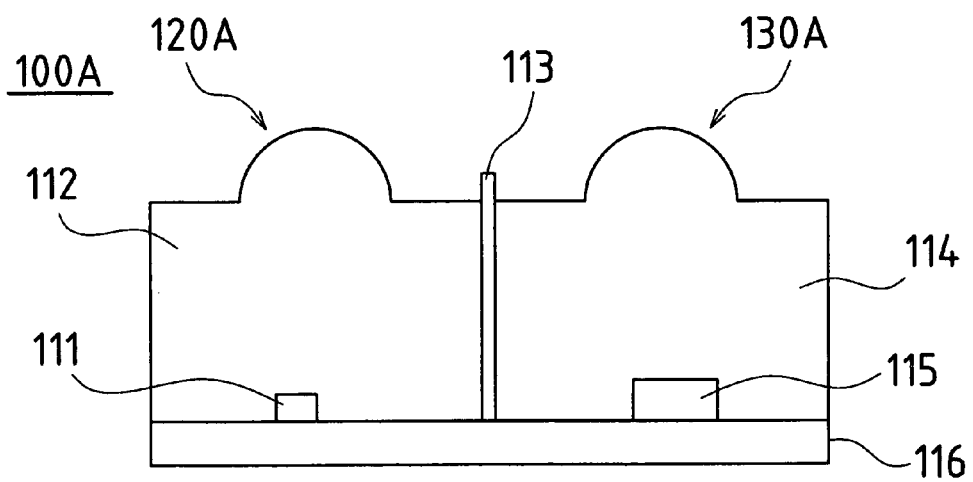
FIG. 3 is a cross-sectional view showing a modified example of the reflective encoder associated with Embodiment 1 of the present invention.

FIG. 3 is a cross-sectional view showing a reflective encoder 100A associated with a modified example of Embodiment 1 of the present invention.

In the reflective encoder 100A, a light emitting element 111 and a light receiving element 115 are mounted on a single substrate 116. The light emitting element 111 and the light receiving element 115 are covered by a light emitting side transparent resin body 112 and a light receiving side transparent resin body 114 respectively. A light shielding body 113 formed using an opaque resin is arranged on the boundary part between the light emitting side transparent resin body 112 and the light receiving side transparent resin body 114.

Because the reflective encoder 100A has such a configuration, the light emitted from a light emitting portion 120A (portion including the light emitting element 111 and the light emitting side transparent resin body 112) is imparted with variable intensity due to the code wheel (not shown), and is received at the partitioned PD formed on the light receiving element 115 of a light detecting portion 130A (portion including the light receiving element 115 and the light receiving side transparent resin body 114).

Thus, by directly mounting the light emitting element 111 and the light receiving element 115 on the substrate 116, it is possible to decrease the thickness of the reflective encoder 100A. Furthermore, by arranging electrodes on the rear of the substrate 116, it is possible to make the reflective encoder 100A leadless type.

Embodiment 2

Embodiment 2 of the reflective encoder of the present invention is described next with reference to the drawings.

Figure 4:
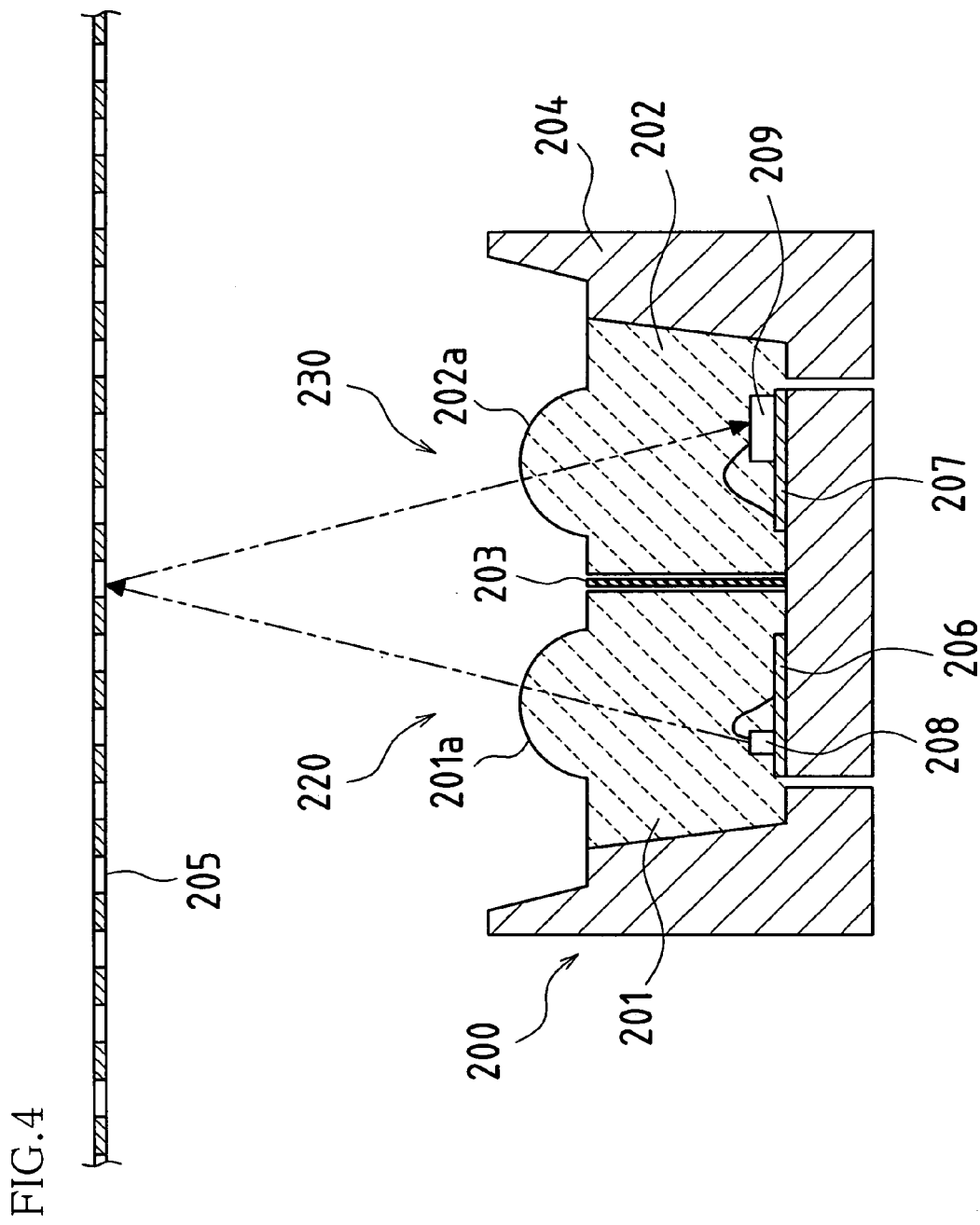
FIG. 4 is a cross-sectional view showing a reflective encoder associated with Embodiment 2 of the present invention.

FIG. 4 is a cross-sectional view showing a reflective encoder 200 associated with Embodiment 2 of the present invention.

In the reflective encoder 100 of Embodiment 1, the light shielding body 107a is molded in a single piece with the secondary mold resin portion 107, however in this case, if the light shielding body 107a does not have a certain thickness then there may be a problem, for example, in that the resin does not penetrate, resulting from the step of molding of the resin. Therefore, it is necessary to set the thickness of the light shielding body 107a such that the resin sufficiently penetrates. As a result, the distance between the light emitting portion 120 and the light detecting portion 130 may increase, possibly leading to a decrease in the optical properties such as the amount of light entering the light detecting portion 130 from the light emitting portion 120.

Therefore, in the present Embodiment 2, in order to further reduce the distance between a light emitting portion 220 and a light detecting portion 230, a secondary mold resin portion 204 is used only to fix the light emitting portion 220 and the light detecting portion 230, and a light shielding body 203 is formed as a part that is separate from the secondary mold resin portion 204. Thus, only a slight gap is provided between the light emitting portion 220 and the light detecting portion 230 in the secondary mold resin portion 204, and the separate light shielding body 203 is inserted into the gap.

That is to say, firstly, the light emitting portion 220 is formed by placing a light emitting element 208 onto a light emitting side frame 206, and then covering the light emitting element 208 with the light emitting side transparent resin body 201 in whose upper part a light emitting side lens 201a is formed. The light detecting portion 230 is formed by mounting a light receiving element 209 onto a light receiving side frame 207, and then covering the light receiving element 209 with a light receiving side transparent resin body 202 in whose upper part a light receiving side lens 202a is formed.

Next, the reflective encoder 200 is formed by sandwiching the light emitting portion 220 and the light detecting portion 230 with the secondary mold resin portion 204 which is made from an opaque resin, so that a small gap remains between the light emitting portion 220 and the light detecting portion 230.

A thin plate-shaped or sheet-shaped light shielding body 203 that does not allow the passage of light and that is of a size or thickness that will fit into the gap between the light emitting portion 220 and the light detecting portion 230 is inserted into the space between the light emitting portion 220 and the light detecting portion 230.

With the present Embodiment 2, the distance between the light emitting portion 220 and the light detecting portion 230 can be made smaller than in the reflective encoder 100 shown in Embodiment 1, and as a result, light that enters the light detecting portion 230 from the light emitting portion 220 due to internal reflection can be eliminated, while at the same time the light from the light emitting portion 220 can be reflected at a code wheel 205 so as to be incident on the light detecting portion 230 effectively and accurately.

Embodiment 3

Embodiment 3 of the reflective encoder of the present invention is described next with reference to the drawings.

Figure 5:
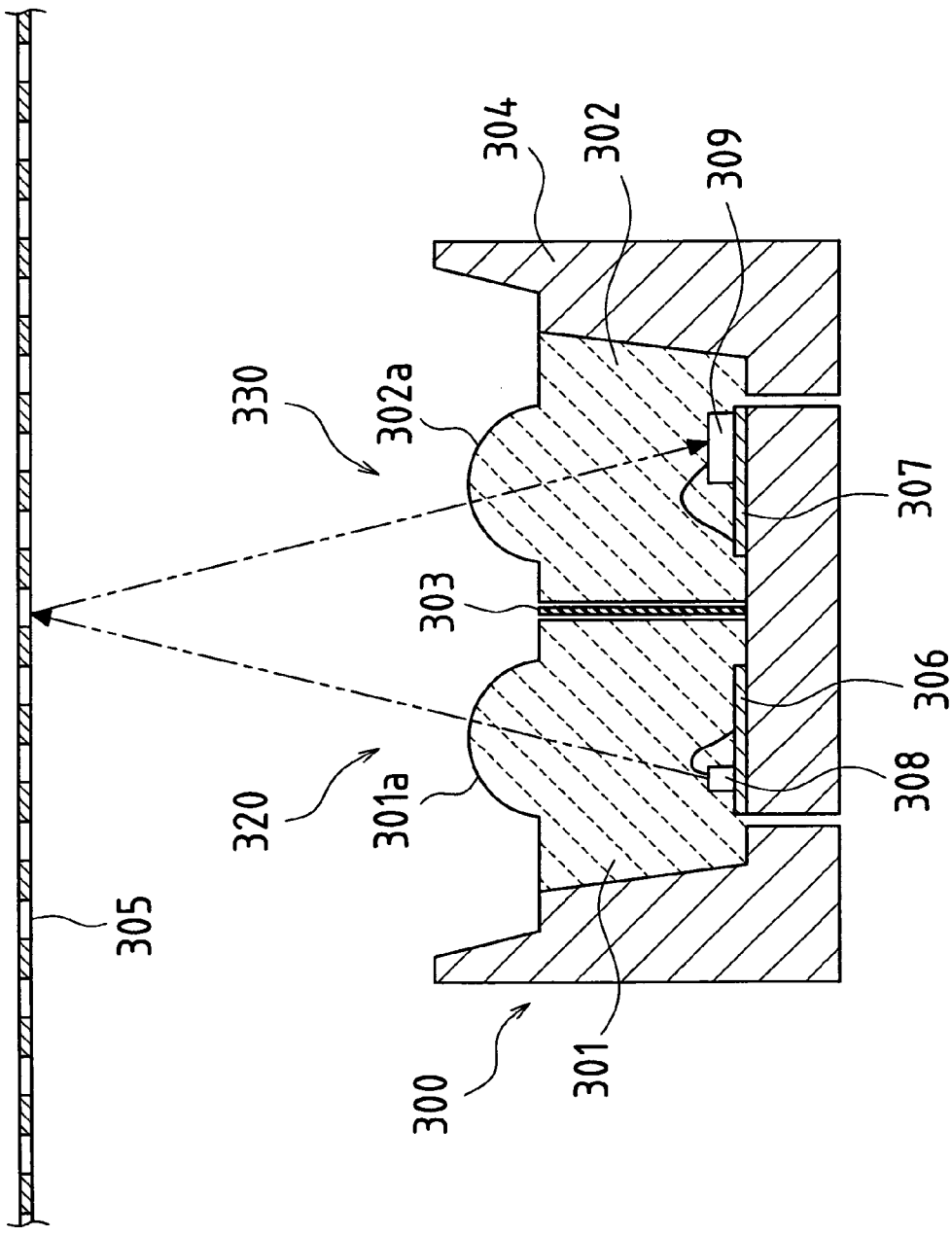
FIG. 5 is a cross-sectional view showing a reflective encoder associated with Embodiment 3 of the present invention.

FIG. 5 is a cross-sectional view showing a reflective encoder 300 associated with Embodiment 3 of the present invention.

The reflective encoder 300 of the present Embodiment 3 is an encoder in which a light shielding body 303 is formed using an opaque liquid resin instead of the sheet-shaped or plate-shaped light shielding body 203 as in the reflective encoder 200 of the above noted Embodiment 2.

That is to say, firstly, a light emitting portion 320 is formed by mounting a light emitting element 308 onto a light emitting side frame 306, and then covering the light emitting element 308 with the light emitting side transparent resin body 301 in whose upper part a light emitting side lens 301a is formed. A light detecting portion 330 is formed by mounting a light receiving element 309 onto a light receiving side frame 307, and then covering the light receiving element 309 with a light receiving side transparent resin body 302 in whose upper part a light receiving side lens 302a is formed.

Next, the reflective encoder 300 is formed by sandwiching the light emitting portion 320 and the light detecting portion 330 with the secondary mold resin portion 304 which is made from an opaque resin, so that a small gap remains between the light emitting portion 320 and the light detecting portion 330.

The opaque liquid resin is then poured into the space between the light emitting portion 320 and the light detecting portion 330, and cured to form the light shielding body 303, which does not allow the passage of light, between the light emitting portion and the light detecting portion 330.

According to the present Embodiment 3, the light shielding body 303 is originally a liquid, so that the distance between the light emitting portion 320 and the light detecting portion 330 can be reduced further than in Embodiment 2, and as a result, light that enters the light detecting portion 330 from the light emitting portion 320 due to internal reflection can be eliminated, while at the same time the light from the light emitting portion 320 can be reflected at a code wheel 305 so as to be incident on the light detecting portion 330 effectively and accurately.

Embodiment 4

Embodiment 4 of the reflective encoder of the present invention is described next with reference to the drawings.

Figure 6:
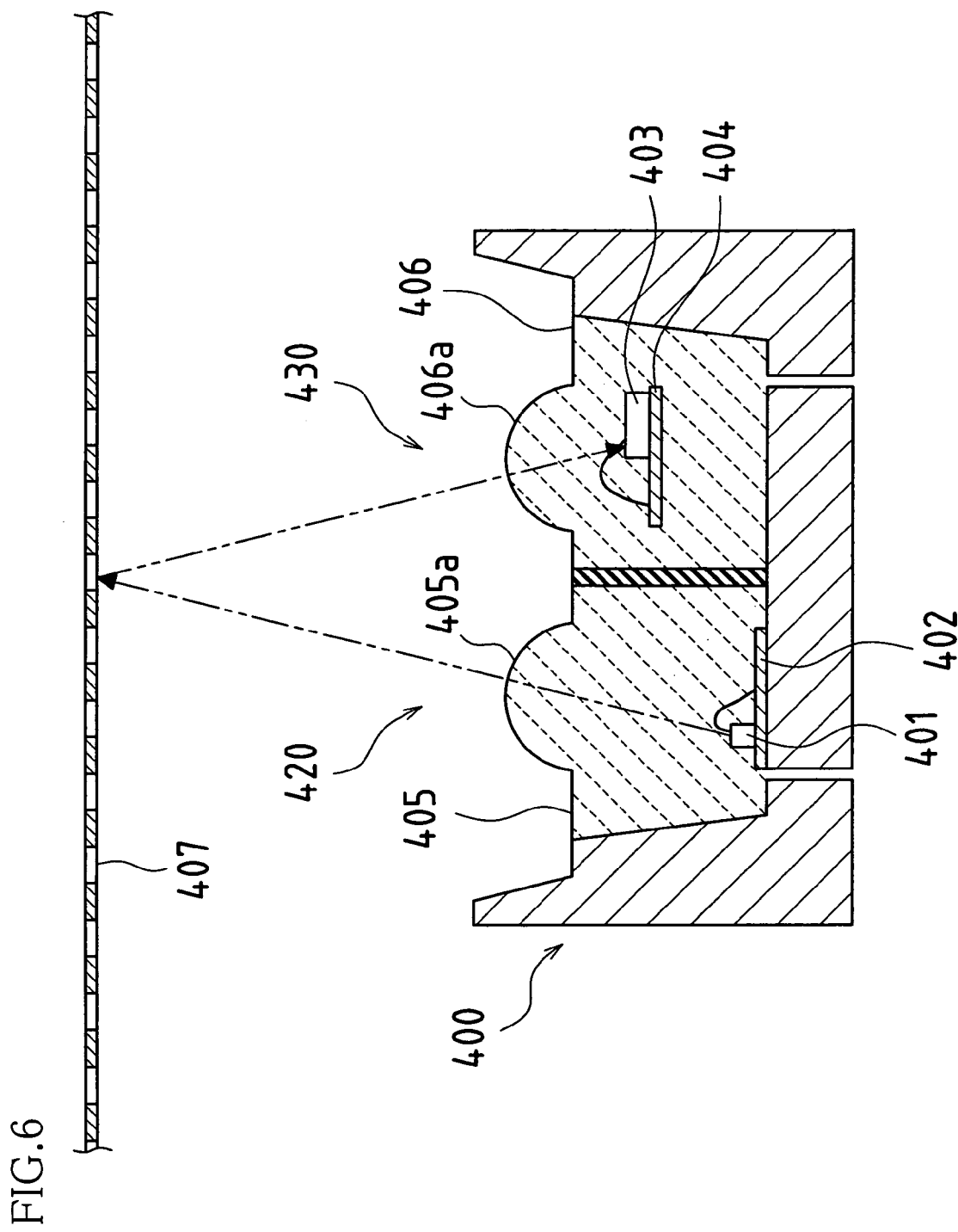
FIG. 6 is a cross-sectional view showing a reflective encoder associated with Embodiment 4 of the present invention.

FIG. 6 is a cross-sectional view showing a reflective encoder 400 associated with Embodiment 4 of the present invention.

In the reflective encoder 400 of the present Embodiment 4, a light emitting portion 420 and a light detecting portion 430 are molded separately. Utilizing this fact, the height of a lead frame (a light emitting side frame) 402 in the light emitting portion 420 on which a light emitting element 401 is mounted, and the height of a lead frame (a light receiving side frame) 404 in the light detecting portion 430 on which a light receiving element 403 is mounted are altered. That is to say, the height from the bottom surface of a light emitting side transparent resin body 405 to the light emitting side frame 402 is made to differ from the height from the bottom surface of a light receiving side transparent resin body 406 to the light receiving side frame 404.

As a result, the distance from the light emitting element 401 to a light emitting side lens 405a can be made different from the distance from the light receiving element 403 to a light receiving side lens 406a.

For example when the light receiving element 403 approaches the light receiving side lens 406a, the intensity of the light when it is received is greater, and the amplitude (voltage value) of the output signal increases. On the other hand, when the position or height of the light emitting element 401 is adjusted, the direction and the focal properties of the light emitted from the light emitting side lens 405a can be changed.

Since the reflective encoder 400 is configured as such, the optical properties of the reflective encoder 400 can be improved by altering the height of the lead frame (the light emitting side frame) 402 on which the light emitting element 401 is mounted, or the height of the lead frame (the light receiving side frame) 404 on which the light receiving element 403 is mounted in order to adjust them to the most appropriate position or height.

Embodiment 5

Embodiment 5 of the reflective encoder of the present invention is described next with reference to the drawings.

FIG. 7(a) and FIG. 7(b) are explanatory diagrams showing a reflective encoder 601 associated with Embodiment 5 of the present invention, where FIG. 7(a) is a top view and FIG. 7(b) is a lateral view.

In Embodiment 5 of the present invention, the reflective encoder 601 is used for detecting the rotational speed or rotational direction of a shaft 603 of a motor or the like.

Moreover, the alignment direction of a light emitting portion 604 and a light detecting portion 605, which are constituent elements of the reflective encoder 601, is parallel to a direction D2, which is perpendicular to a diametrical direction D1 of a code wheel 602.

As the reflective encoder 601 contains such a structure, it is possible to provide the reflective encoder 601 closer to the shaft 603. As a result, even if the code wheel 602 is small, the reflective encoder 601 may be provided within the code wheel 602, and it is possible to reduce the size of the device, and more specifically, to miniaturize the motor in which such a reflective encoder 601 is incorporated. Further, it is also possible to achieve more compact electronic devices that use these reflective encoders.

Embodiment 6

Embodiment 6 of the reflective encoder of the present invention is described next with reference to the drawings.

Figure 8B:
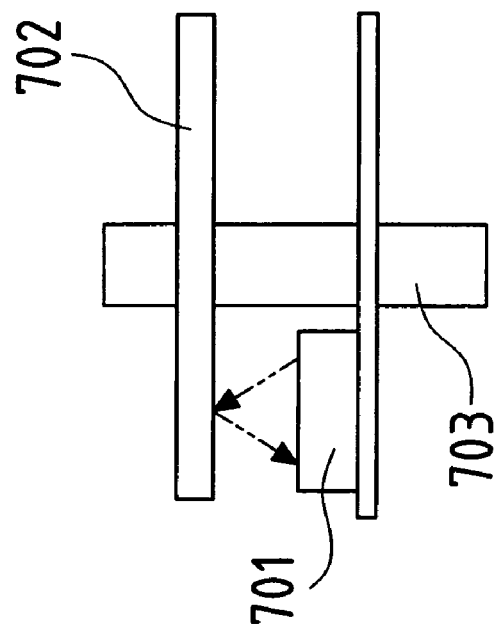
FIG. 8(b) is a diagram showing a side view thereof.
Figure 8A:
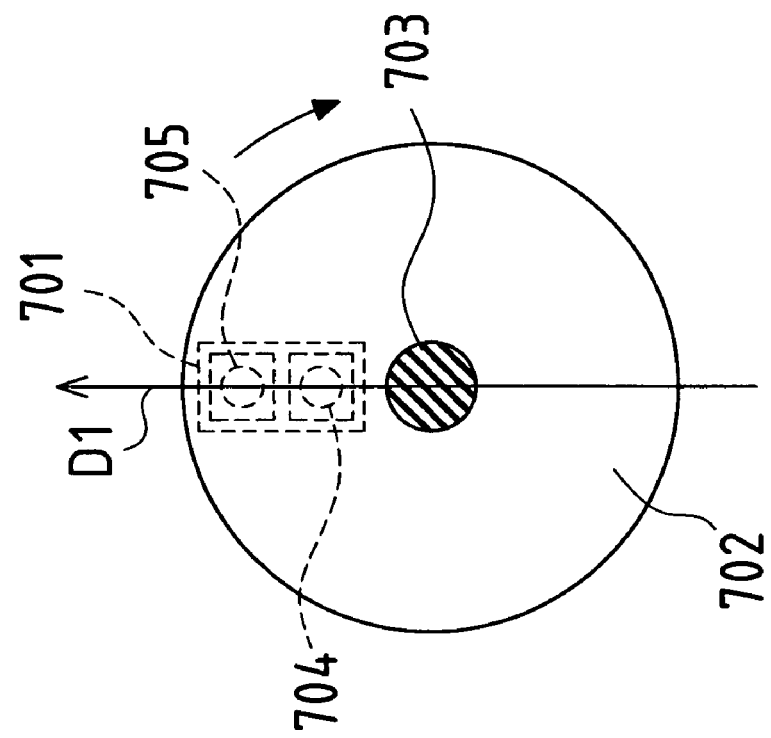
FIG. 8(a) is an explanatory diagram showing a top view of a reflective encoder associated with Embodiment 6 of the present invention.

FIG. 8(*a*) and FIG. 8(*b*) are explanatory diagrams showing a reflective encoder 701 associated with Embodiment 6 of the present invention, where FIG. 8(*a*) is a top view and FIG. 8(*b*) is a lateral view.

In the present Embodiment 6, the reflective encoder 701 is used for detecting the rotational speed or rotational direction of a shaft 703 of a motor or the like.

Furthermore, a light emitting portion 704 and a light detecting portion 705, which are constituent elements of the reflective encoder 701, are aligned along a diametrical direction D1 of a code wheel 702.

With such a structure, since the light that strikes the code wheel 702 is distributed symmetrically to the left and right about the diametrical direction D1, and the light that enters the light detecting portion 705 is symmetrical to the left and right, as a result, the waveform of the output signal has a more preferable shape.

Embodiment 7

Embodiment 7 of the reflective encoder of the present invention is described next with reference to the drawings.

Figure 9:
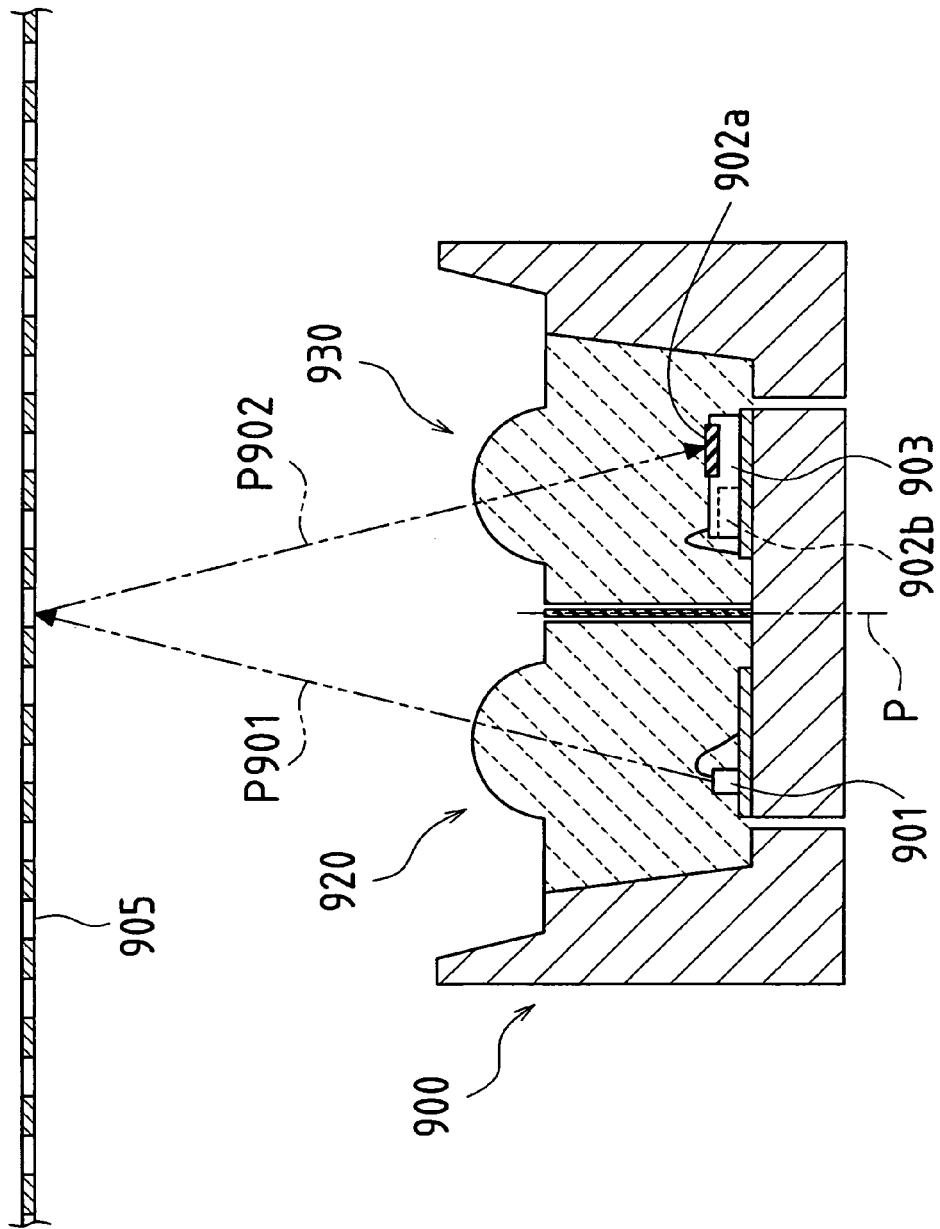
FIG. 9 is a cross-sectional view showing a reflective encoder associated with Embodiment 7 of the present invention.

FIG. 9 is a cross-sectional view showing a reflective encoder 900 associated with Embodiment 7 of the present invention.

A light beam P901 that is emitted from a light emitting element 901 of a light emitting portion 920 becomes a reflected light beam, P902 by reflection at a code wheel 905, and enters a light detecting region 902*a* on top of a light receiving element 903 of a light detecting portion 930.

In the present Embodiment 7, the light receiving element 903 has the light detecting region 902*a* and a signal processing circuit 902*b*. The light detecting region 902*a* of the light receiving element 903 is arranged away from the center P of the reflective encoder 900, and the signal processing circuit 902*b* is arranged toward the center P of the reflective encoder 900.

With such a structure, it is possible to prevent the light detecting portion 930 from becoming large due to the signal processing circuit 902*b*.

Embodiment 8

Embodiment 8 of the reflective encoder of the present invention is described next with reference to the drawings.

Figure 10:
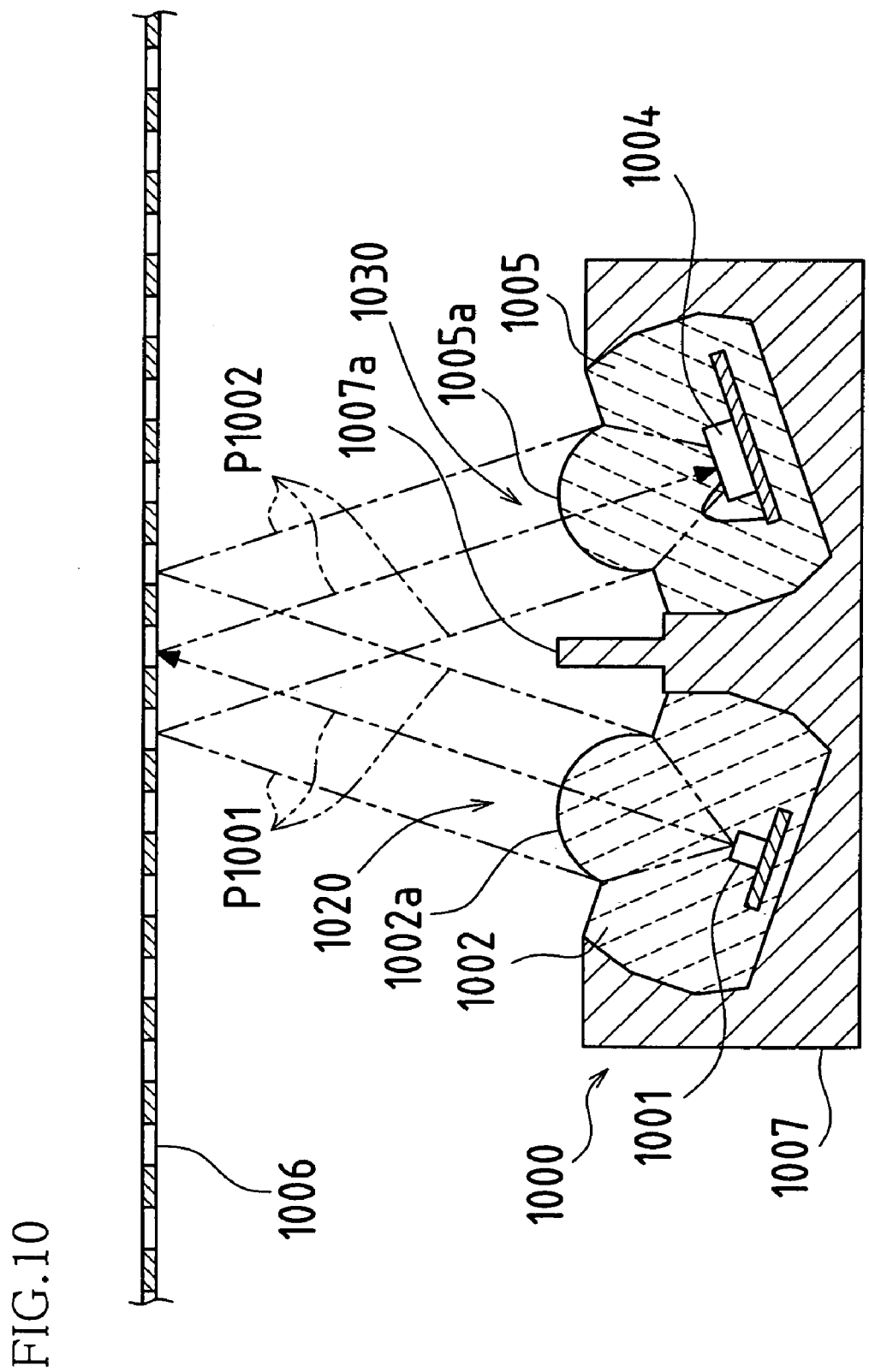
FIG. 10 is a cross-sectional view showing a reflective encoder associated with Embodiment 8 of the present invention.
Figure 11:
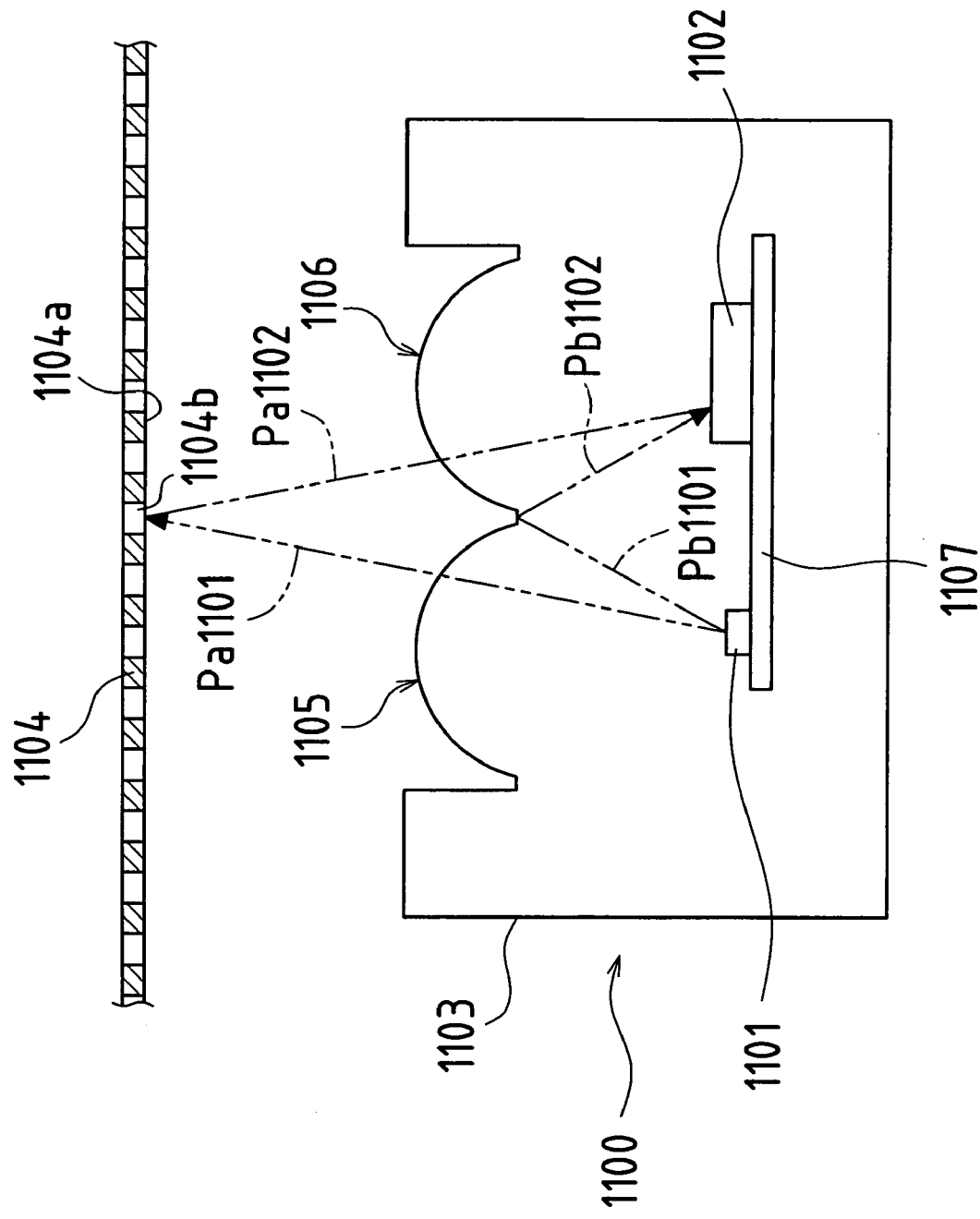
FIG. 11 is an overview showing an example of a conventional reflective encoder.
Figure 12:
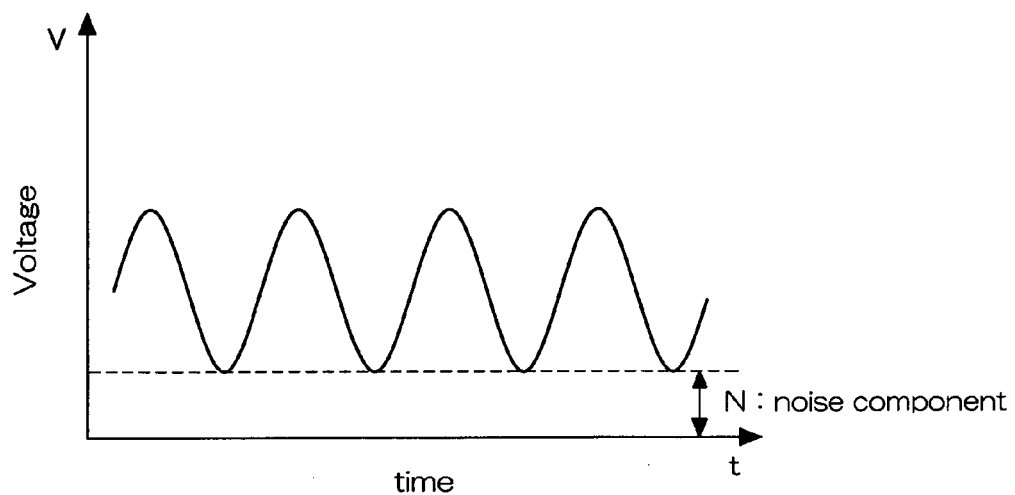
FIG. 12 is a graph showing an example of an output signal waveform when an undesired signal is generated in a light detecting element.
Figure 13:
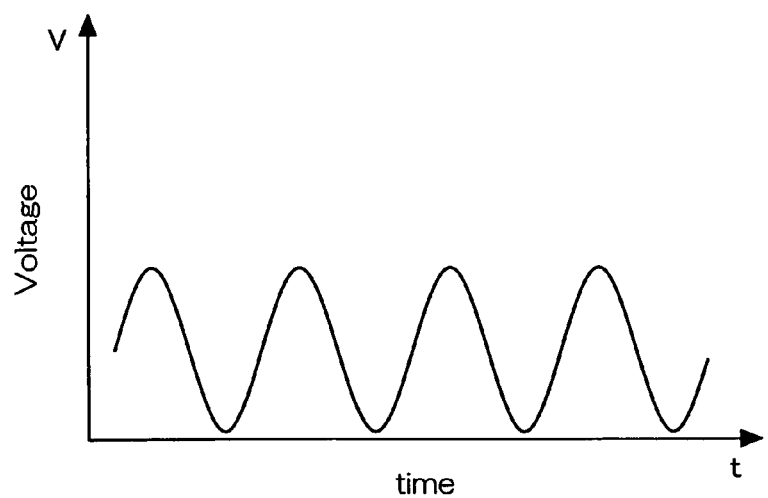
FIG. 13 is a graph showing an example of an output signal waveform when an undesired signal is not generated in the light detecting element.

FIG. 10 is a cross-sectional view showing a reflective encoder 1000 associated with Embodiment 8 of the present invention.

In Embodiment 8, a light emitting element 1001 of a light emitting portion 1020 is arranged on the optical axis of a light emitting side lens 1002*a* of a light emitting side transparent resin body 1002, and a light beam P1001 that is emitted from the light emitting element 1001 is effectively exited from the light emitting side lens 1002*a*. The light beam P1001 is reflected by a code wheel 1006 to become a reflected light beam P1002. The principal light beam of the reflected light beam P1002 strikes along the optical axis of, and is focused by a light receiving side lens 1005*a* that is formed on the upper portion of a light receiving side transparent resin body 1005. The light is then received by a light receiving element 1004 that is arranged on the optical axis of the light receiving side lens 1005*a* of the light detecting portion 1030.

Thus, as well as arranging the light emitting element 1001 and the light receiving element 1004 on the optical axis of the light emitting side lens 1002*a* and the light receiving side lens 1005*a* respectively, the light emitting portion 1020 and the light detecting portion 1030 are arranged at a slant such that they face toward each other (that is, a secondary mold resin portion 1007 fixes the light emitting portion 1020 and the light detecting portion 1030 such that the optical axis of the light emitting side lens 1002*a* and the light receiving side lens 1005*a* intersect at those regions of the code wheel 1006 surface above a light shielding body 1007*a*). Thus, the light may be used more efficiently. It should be noted that the light emitting portion 1020 and the light detecting portion 1030 may be easily and accurately arranged at a slant by fixing the light emitting portion 1020 and the light detecting portion 1030 with the secondary mold resin portion 1007.

It should be noted that the electronic device of the present invention is a device in which at least one of any of the reflective encoders described in Embodiment 1 to Embodiment 8 is included. A more compact, more accurate electronic device may be obtained by having such a configuration.

With regard to industrial applicability, the reflective encoder and the electronic device in which the reflective encoder is used, of the present invention may be ideally utilized in, or as, electronic devices such as consumer devices or factory automating apparatuses.

The present invention can be embodied and practiced in other different forms without departing from the spirit and essential characteristics thereof Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A reflective encoder comprising:

a light emitting portion having a light emitting element capable of irradiating light and a light emitting side transparent resin body for covering and protecting the light emitting element, a light detecting portion having a light receiving element for detecting light that is irradiated horn the light emitting element and that is reflected by a reflecting region of a code wheel, and a light receiving side transparent resin body for covering and protecting the light receiving element, and a light shielding body arranged between the light emitting side transparent resin body and the light receiving side transparent resin body for separating the light emitting portion and the light detecting portion, wherein the light receiving element has a light detecting region and a signal processing circuit, the light detecting region is arranged away from the center of the reflective encoder and the signal processing circuit is arranged toward the center of the reflective encoder.

* * * * *